United States Patent

[11] 3,596,140

[72] Inventor Ronald A. Walsh
191 Plymouth Lane, Apt. A, Glen Burnie, Md. 21061

[21] Appl. No. 881,122
[22] Filed Dec. 1, 1969
[45] Patented July 27, 1971
Continuation-in-part of application Ser. No. 870,518, Oct. 22, 1969.

[54] DEMOUNTABLE PERIPHERAL-CONTACT ELECTRONIC CIRCUIT BOARD ASSEMBLY
8 Claims, 8 Drawing Figs.

[52] U.S. Cl. .......... 317/101 DH, 174/68.5, 339/17 M
[51] Int. Cl. .......... H05k 1/07, H05k 5/06
[50] Field of Search .......... 317/101; 174/68.5; 200/166 PC, 168; 334/85; 339/17

[56] References Cited

UNITED STATES PATENTS

| | | | |
|---|---|---|---|
| 2,976,806 | 3/1961 | Risk et al. | 317/101 R |
| 3,200,297 | 8/1965 | Gibson | 317/101 (DH) |
| 3,234,433 | 2/1966 | Braunagel | 317/101 (D) |
| 3,290,559 | 12/1966 | Kirby et al. | 317/101 (D) |
| 3,368,115 | 2/1968 | Hoffman | 317/101 (DH) |
| 3,370,202 | 2/1968 | Marley | 317/101 (CX) |
| 3,500,131 | 3/1970 | Seeley et al. | 317/101 (DH) |

*Primary Examiner*—J. R. Scott
*Attorney*—John F. Mc Clellan, Sr

ABSTRACT: A demountable peripheral-contact electronic circuit-board assembly including an electrically insulative tubular housing having slots in the inner wall parallel to the housing, the housing accommodating an aligned array of parallel-spaced substantially disc-shaped circuit boards having contacts protruding into the slots in the housing, and removable conductive rails in the housing slots for interconnecting the circuit boards through the protruding contacts. The conductive rails are provided selectively with insulated areas to isolate particular circuit-board contacts where required. An exterior hermetic enclosure protects and cushions the assembly and provides for exterior electrical connection through an interior manifold type terminator in contact with the conductive rails.

INVENTOR.

R. A. WALSH.

BY John F. McClellan Sr.

ATTORNEY

INVENTOR.
R. A. WALSH.
BY
John F. McClellan Sr
ATTORNEY

DEMOUNTABLE PERIPHERAL-CONTACT ELECTRONIC CIRCUIT BOARD ASSEMBLY

This application is a continuation-in-part of my prior filed application for U.S. Pat. entitled "Demountable Assembly and Packaging for Electronic Components" Ser. No. 870,518 filed Oct. 22, 1969.

This invention relates generally to electronic assemblies, and specifically to improved means and method for interconnecting and housing a plurality of electronic circuit-boards of novel design having discrete or integrated circuit components mounted thereon.

In the prior art, electronic circuit-boards have been interconnected as a general rule by soldering, and also by the use of conventional wiring with hardware such as jack-and-plug connectors, or screw connectors.

Soldered connections are semipermanent, require reheating to disconnect, and require many individual disconnections to disassemble electronic assemblies so connected.

Jack-and-plug connections and other quick-disconnect means employing conventional hardware are bulky and cumbersome to use as individual connections and require preassembly of numbers of elements if they are to be used in gangs.

The shapes of conventional electronic circuit-board assemblies have compounded the difficulty of providing reliable convenient, readily inspected, flexibly rearrangeable quick-disconnect interconnections.

It is therefore an object of this invention to provide a demountable electronic circuit-board housing and interconnective system which avoids these difficulties of the prior art.

I accomplish this and the following objects of this invention by providing disc-shaped electronic boards for layered stacking in cylindrical array, and by providing a special tubular container affording electrical isolation with disc-interconnection through edge contacts on the discs, made by removable conductive rectilinear members contained in the inner surface of the container parallel with the cylinder axis. An outer, hermetic housing is also provided.

Further objects of my invention are to provide a system as described having maximum reliability under all conditions of use and at the same time affording maximum ease, speed, safety, and flexibility for assembly, disassembly, modification, and testing; to provide a system as described which is adapted for extremely high density packaging of electronic circuits in assembly, but is at the same time provided with an extremely great number of quick change interconnections; to provide a system as described in which all parts and components are located and interrelated with complete support on all sides, and in which all parts and components are cushioned on all sides against destructive acceleration, as from vibration or impact; to provide a system as described which is economically adapted for high speed, automated fabrication and testing; and to provide a system as described which affords all these interconnective and protective advantages without the use of any separable conventional hardware such as nuts, bolts, clips, bits of wire and the like, whatsoever.

These and other objects and advantages of my invention will become better understood and appreciated after study of the following description and drawings.

In the drawings:

FIG. 1 and FIG. 7 show the general relations of the parts of this invention.

Figure 1:
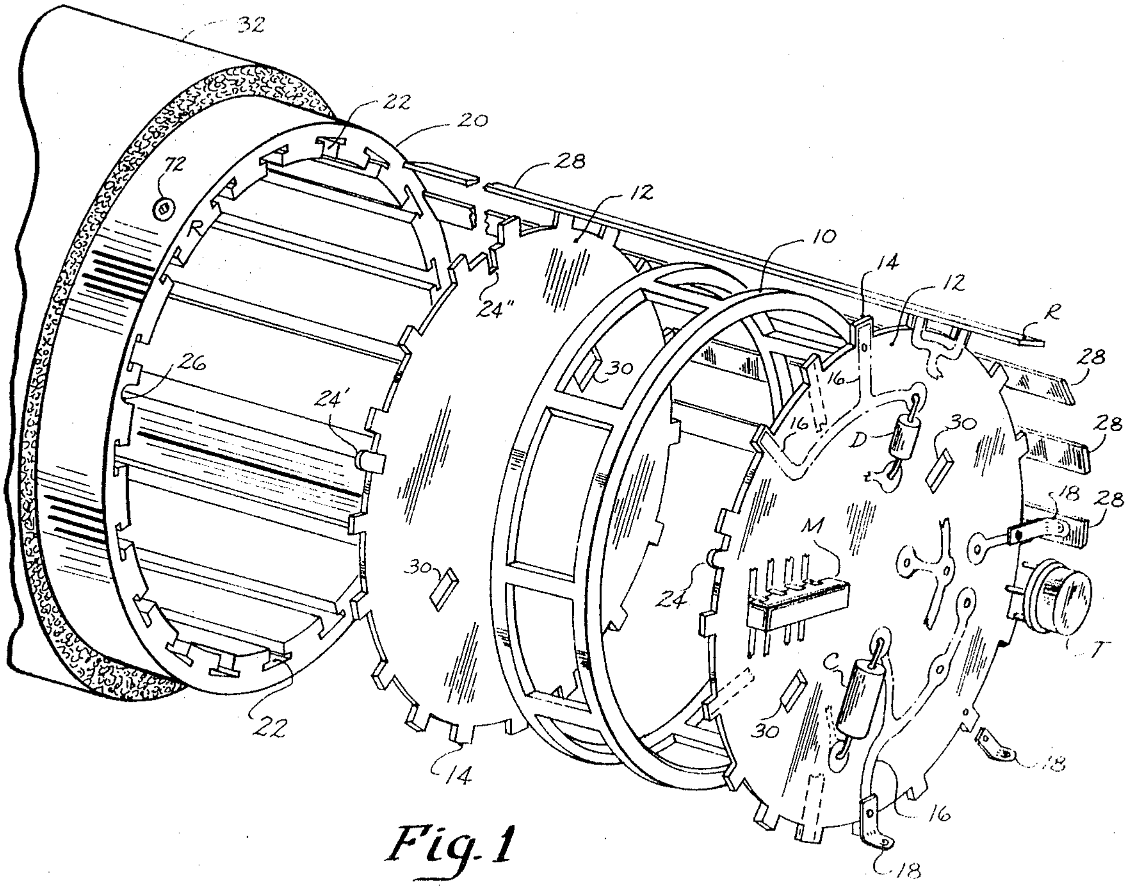
FIG. 1 is a perspective view of a portion of an assembly according to this invention, exploded to show relations of the parts.

The housing and pressure cap are removed, and part of the contents are shown separated for better exposition, in FIG. 1.

Turning now to FIG. 1 in detail, the circuit-boards 12 are discs with serrated or splined peripheries, having protruding lugs 14 at regular annular intervals.

The boards 12, or any of them, may be of the type processed one or more complete integrated circuits, with all components being part of printed, etched or otherwise fabricated, wholes. Alternatively, the boards 12 may bear discrete components interconnected to form required circuits, or may bear hybrid circuits, as desired. It will be seen in any case that the boards are ideally adapted for automatic mass production and testing of circuits on the individual boards by machines prior to final assembly of the boards together.

Electronic components such as diode D, transistor T, integrated circuit module M and capacitor C, may, for example, be mounted on either said of any of the boards as necessary for the particular application. The leads 16 for interconnection with other parts of the assembly terminate in resilient contact fingers 18 positioned on the lugs. The components, leads, and boards are of conventional materials. The boards may be of epoxy-fiber glass, of phenolic fiber board, or of the moldable plastics, for example, and the leads may be printed circuitry.

Tubular spacers 10 separate the boards and also serve as shock absorbers and assembly tighteners, as will be noted later. The spacers may be of molded polyethylene and may have apertured walls, as shown, for better heat transfer, for better shock absorption, or for lessening weight. Resilient sponge plastic or rubber discs may also be employed.

The boards are contained in a cylinder 20 having an array of rectilinear T-shaped slots 22 around the inner wall parallel to the cylinder axis. The cylinder may be of any suitable insulative material, such as polycarbonate plastic.

Each of the lugs 14 fits in the upright part of one of the "T" slots.

As an optional but desirable feature, each board has a peripherally located, rounded key lug 24, which orients the board uniquely on assembly. This key lug need not be integral, but can be positionable at any suitable location on the periphery, as at 24′ and 24″. This key lug is positioned closer to one regularly spaced lug adjacent to it than to the regularly spaced lug adjacent to it on the other side, and is adapted to fit into a key slot 26 in the cylinder 20, so that misorientation is prevented. It will be noted that the key provision is slightly off-center between adjacent indexing features, so that both the lugs and the faces of the boards are uniquely oriented.

The assembled boards are interconnected by conductive rails 28, which fit into the crossbar recesses of the T-shaped grooves in the cylinder, and electrically connect the resilient contact fingers 18 on the board lugs. The conductive ails are of various configurations, as will be seen in reference to FIGS. 2 through 5 below, but in every case are firmly and continuously supported by the grooves.

Apertures 30 are provided in the boards to facilitate removal, as by a wishbone-type retriever tool, not shown.

Sleeve 32 provides for thermal insulation and mechanical shock absorption between cylinder 20 and the outer housing 42, which will be described in reference to FIG. 7.

Figures 2, 4:
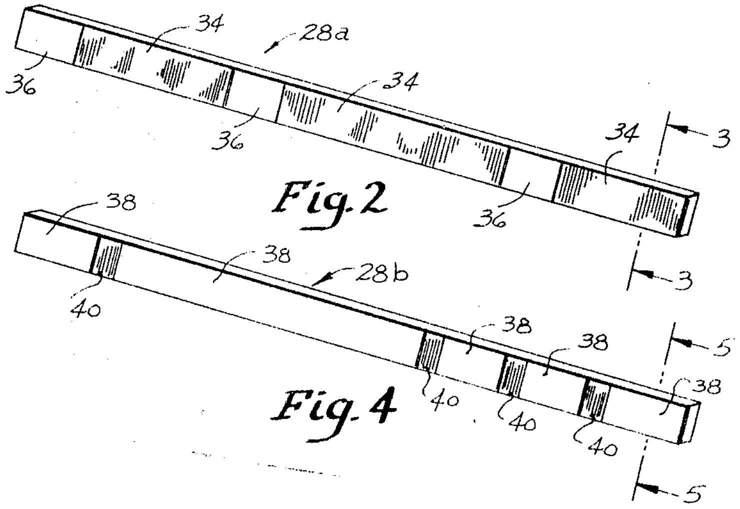
FIG. 2 is a perspective view of a connective rail.
FIG. 4 is a perspective view of another connective rail.
Figure 3:
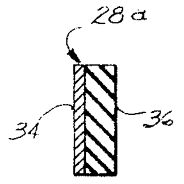
FIG. 3 is a section taken at 3–3, FIG. 2.

FIG. 2 is a perspective view, and FIG. 3 is a section taken at 3–3, FIG. 2, of a length of an embodiment 28*a* of the conductive rails of FIG. 1.

In this embodiment the rail proper is made of an insulative plastic such as solid polystrene, polyurethane, Teflon, or the like, indicated by reference numeral 36, made selectively conductive in area at appropriate intervals on the contacting face as by thinly layered, deposited, or otherwise applied metal 34 such as copper, in order to interconnect certain boards and bypass others in accomplishing desired circuitry.

The thickness proportions shown in FIG. 3 may be used if the metal is inset, as for high current capacity; the front surface of the plastic in any case is made practically flush with the adjacent conductive surfaces.

If it is necessary simply to connect to one finger of every board, as in bonding, the rail can be bare copper. If certain boards are to be skipped, and have no fingers at the particular annular location passed by the rail, the rail can also be bare copper.

Figure 5:
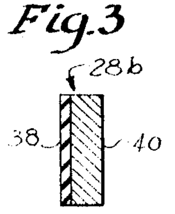
FIG. 5 is a section taken at 5–5, FIG. 4.

FIG. 4 shows in perspective, and FIG. 5 in section, a rail, **28*b*, which is the functional inverse of the rail of FIGS. 2 and 3. In this embodiment the rail proper, 40, is conductive and is selectively inset with insulative areas 38**, to interconnect adjacent boards locally.

To provide the selective areas, the conductor rails may be processed in the same manner as standard printed circuit boards. That is, conductive or insulative portions may be chemically removed, or may be removed by automatic machining procedures. In either case, fabrication of the interconnective members, and accomplishment of the interconnections themselves, represents a great saving in time and cost over cost of conventional hand-routing and soldering methods.

Figure 6:
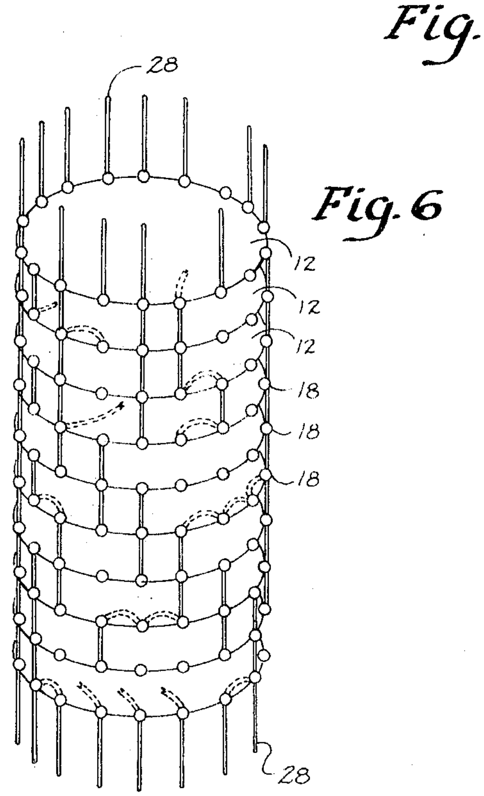
FIG. 6 is a pictorial representation in perspective of an exemplary electrical interconnection according to this invention.

FIG. 6 shows typical board-to-board schematic interconnections afforded by this invention. Rails 28 can be either of type **28*a* or 28*b* (the gaps indicating insulated portions) and the boards 12 can have finger 18** at every annular interval, or not, as desired. It will be appreciated that the number of rails and terminator pins which can be used is limited only by the space available and the size requirement of the components. The proper locations of the rails may be indicated by markings on the faces or ends of the rails, and corresponding markings on the cylinder, as at "R," FIG. 1.

Figure 7:
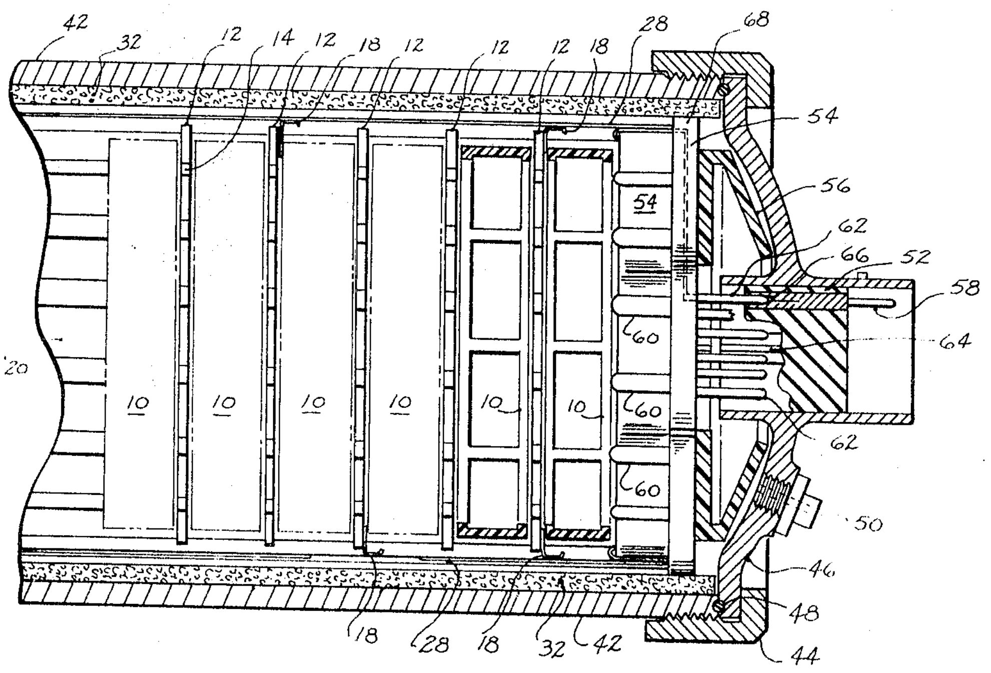
FIG. 7 is a longitudinal partial section of a portion of an assembly according to this invention.

FIG. 7 is a detail in partial section of the system of this invention assembled and ready for use.

Boards 12 are tightly cushioned and secured at proper intervals by spacers 10. Resilient fingers 18 provide board interconnection through contact with conductive rails 28. Cylinder 20 is radially cushioned and secured within a metal housing 42 by sleeve 32. The metal housing 42 is threaded at each end (or one end may be blind) and is closed by a threaded retainer ring 44 which draws a pressure cap 46 against an O-ring seal 48 in the end of the housing. The pressure cap 46 is preferably furnished with a purge fitting 50, for flushing with dry gas, such as nitrogen. The pressure cap 46 can have, as shown, an integral hermetic connector 52 for passing through the pressure cap a plurality of electric leads corresponding in number to the number of rails, or a flat land can be provided on cap 46, and drilled for any size standard connector.

Electric continuity between the rails and the pins 58 of the hermetic connector is provided in the form of a terminator 54, which may be of molded plastic, and which is positioned by a compression bellows 56 which may be of polycarbonate plastic or the like. The compression bellows is in turn positioned by end cap 46.

Figure 8:
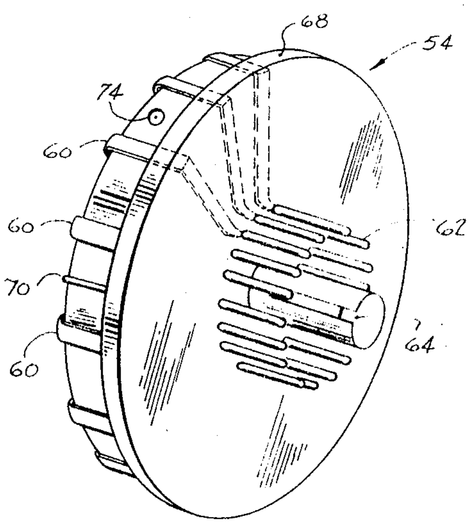
FIG. 8 is a perspective of a terminator.

FIG. 8 shows the terminator in perspective. Each strip 60 is adapted to fit within the upright portion of a "T" section groove 22 in cylinder 20 (see FIG. 1) and to make contact by spring action of the strip with the conductive rail in the crossbar of the "T" section of the groove. Each strip 60 connects electrically with a pin 62 in the terminator, which is keyed by fitting 64 to engage hermetic fitting 52, so that the pins 62 of the terminator engage the proper receptacles 66 of the hermetic fitting. Protrusion 70 engages key slot 26 in cylinder 20 (FIG. 1) to insure proper orientation between the terminator and the cylinder.

Ends of the rails rest against and are positioned by flange 68 of the terminator, so that sudden end-thrust loading against the cushioning provision will tend to move the entire rail, board, and terminator assembly together axially within the limits of compression of bellows 56 and pin travel in the connector, thus preserving connective relations.

Several additional advantageous aspects of my invention can be explained in the light of the foregoing detailed descriptions.

For example, it will be appreciated that the rails can be applied to the layered board and spacer assembly in a jig, and the entire assembly tested outside the cylinder with complete access to all parts.

Again, the cylinder itself can be used as a jig for testing or, with slight modification to retain the terminators to the cylinder, as by setscrew 72, FIG. 1, which can engage terminator recess 74, FIG. 8, the cylinder and contents can be used without the housing 42, where hermetic capability is not essential. A plurality of such units can be used as plug-in units on a master circuit-board tying the group together.

It can be seen also that the cylinder, the metal housing, and the rails can readily be cut to desired length, and that the metal housing particularly can be readily increased in length by the simple measure of coupling together two sections with a coupling-sleeve and O-ring.

The components can be assembled and disassembled in any of various ways—for example, the rails can be installed in the cylinder before, after, or simultaneously with the boards.

Substitution of boards or of rails thus becomes a matter of moments, in spite of the very high density packaging, the flexible provisions for complex and intricate interconnections, and the massive protection provided against hostile environmental factors of all types.

Other variations in materials and structure are entirely feasible. For example the housing may be of high impact plastic. Again, on assembly one or more of the rails may be deleted entirely if not needed. It will be seen that in any case the circuit-boards are supported throughout the peripheries both radially and axially.

If desired, the cross section of the housing can be other than circular. Any regular polygonal shape can be used which provides for insertion of the boards at selected orientations about the housing axis, the exact orientation of each to be fixed by a key, if desired, in analogy to the circular configuration in which any contact can be disposed in any slot.

It will be seen also that the present invention if used without the key between cylinder and boards, or with a modified key, provides a system in which contact relation can be changed if desired by reversing face of a board or boards on assembly, further adding to the tremendous multipurpose flexibility of the system.

Obviously many modifications and variations of the present invention are possible in light of the above teachings. It is, therefore, to be understood that within the scope of the appended claims the invention may be practiced otherwise than as specifically described.

I claim:

1. A demountable peripheral-contact electronic circuit-board assembly comprising: plural circuit-board means, peripheral contact means on said circuit-board means, positioning means for parallel-spacing and aligning said circuit-board means, and conductive means for detachably connecting plural of said peripheral contact means; said condu tive means being rectilinear and including an integral insulative portion intermediate the ends thereof, and said positioning means including a tubular container having a rectilinear slot in the inner wall parallel with the axis thereof for containing said conductive means.

2. A demountable peripheral-contact electronic circuit-board assembly as recited in claim 1, said positioning means including a terminator at an end of the tubular means, and a connector on the terminator for contacting said conductive means.

3. A demountable peripheral-contact electronic circuit-board assembly as recited in claim 2, said conductive means being recessed with said slot, and said peripheral contact means including structure for resiliently urging a portion of said contact means against said conductive means in said slot.

4. A demountable peripheral-contact electronic circuit-board assembly as recited in claim 3, the tubular container having a plurality of said slots containing a respective plurality of said conductive means in the inner wall of said tubular container parallel with the axis thereof.

5. A demountable peripheral-contact electronic circuit-board assembly as recited in claim 4, the tubular housing being cylindrical and having said slots at regularly spaced annular intervals, and the respective circuit-board means being disc shaped and having peripheral portions protrusive into said slots.

6. A demountable peripheral-contact electronic circuit-board assembly as recited in claim 5, the slots being T-shaped and containing the respective conductive means in the respective crossarms of the T-shapes, and all said circuit-board means and terminator being fixed in rotation about the axis of the tubular container.

7. A demountable peripheral-contact electronic circuit-board assembly as recited in claim 6, and an exterior housing having a detachable hermetic-sealing member, said detachable hermetic sealing member having hermetic electrical connector means passing therethrough and engaging said terminator connector.

8. A demountable peripheral-contact electronic circuit-board assembly as recited in claim 7, said positioning means comprising: a spacer between plural of the circuit-board means, an axial cushioning member between the detachable hermetic sealing member and the terminator, and a radial cushioning member between the tubular container and the exterior housing.